(12) United States Patent
Avanzino (10) Patent No.: US 7,141,482 B1
(45) Date of Patent: Nov. 28, 2006

(54) METHOD OF MAKING A MEMORY CELL

(75) Inventor: Steven C. Avanzino, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 15 days.

(21) Appl. No.: 10/979,516

(22) Filed: Nov. 2, 2004

(51) Int. Cl.
*H01L 21/20* (2006.01)
*H01L 29/94* (2006.01)

(52) U.S. Cl. ...................... 438/387; 257/301

(58) Field of Classification Search ........ 257/301, 257/306, 330–332; 438/244, 253, 387, 393, 438/780
See application file for complete search history.

(56) References Cited

U.S. PATENT DOCUMENTS

| | | | |
|---|---|---|---|
| 6,433,379 B1 * | 8/2002 | Lopatin et al. ........... 257/301 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B1 | 7/2004 | Krieger et al. | |
| 6,770,905 B1 | 8/2004 | Buynoski et al. | |
| 6,773,954 B1 | 8/2004 | Subramanian et al. | |
| 6,781,868 B1 | 8/2004 | Bulovic et al. | |
| 6,787,458 B1 | 9/2004 | Tripsas et al. | |
| 6,803,267 B1 | 10/2004 | Subramanian et al. | |
| 6,806,526 B1 * | 10/2004 | Krieger et al. ........... 257/296 |

* cited by examiner

*Primary Examiner*—Calvin Lee
(74) *Attorney, Agent, or Firm*—Amin & Turocy, LLP (57) ABSTRACT

Methods of making memory devices/cells are disclosed. First and second electrode layers and a controllably conductive media therebetween are formed over a dielectric layer that has a planar surface and at least one opening. The layers on the dielectric layer planar surface are removed so that the remaining second electrode surface in the opening is co-planar with the dielectric layer planar surface. Methods of using the memory devices/cells, and devices such as computers containing the memory devices/cells are also disclosed.

22 Claims, 3 Drawing Sheets

METHOD OF MAKING A MEMORY CELL

TECHNICAL FIELD

The subject invention generally relates to making a memory cell. In particular, the subject invention relates to method of preventing formation of voids at interfaces between layers in a memory cell structure.

BACKGROUND ART

In the semiconductor industry, there is a continuing trend toward higher device densities. To achieve the high densities there have been, and continue to be, efforts toward scaling down device dimensions (e.g., at sub-micron levels) on semiconductor wafers. In order to accomplish such high device packing densities, smaller feature sizes and more precise feature shapes are required. This may include the width, thickness and spacing of interconnecting lines, spacing and diameter of contact holes, and the surface geometry, such as corners and edges, of various features.

The requirement of small features with close spacing between adjacent features requires sophisticated manufacturing techniques to ensure that quality and operability of the features are not compromised for the purpose of reducing feature size. Among the many aspects related to improving semiconductor fabrication processing to achieve higher density devices, the ability to form thin films, which are substantially free from impurities and defects, remains critical to the structural integrity of smaller features as well as to the performance of the device with respect to increasing the speed of the device. Even minor impurities or defects present on the thin film layer tend to result in poor device characteristics, thereby reducing the effectiveness of the semiconductor device.

Thus, an efficient method to form a thin film is desired to increase productivity, quality, and reliability in IC manufacture.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides upon processes for fabrication a memory cell. A method of making a memory cell in accordance of the subject invention includes providing a dielectric layer having a planar surface and an opening, forming a first and second electrode layers and a controllably conductive media therebetween over the dielectric layer planar surface and in the opening. The first and second electrode layers and controllably conductive media on the dielectric layer planar surface are then removed so that the remaining second electrode surface in the opening is co-planar with the dielectric layer planar surface. One aspect of the subject invention relates to a memory cell made by the fabrication process.

Another aspect of the subject invention relates a method of preventing formation of voids at interfaces between layers in a memory cell structure. The method includes providing a first electrode over a dielectric layer containing at least one opening; forming a passive layer over the first electrode and in the opening, wherein an element of the passive layer is not contacted with an interface between the first electrode and the dielectric layer in an area of the memory cell; forming an active layer and second electrode layer over the dielectric layer and in the opening; and planarizing the structure. When the active layer is formed, the element of the active layer may not be contacted with interfaces between layers of the passive layer, first electrode, and dielectric in the area of the memory cell.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The subject invention relates a method and structures that prevent and/or eliminate depletion of metal from conductive structures and void formation in a memory cell. The method involves providing a dielectric layer having a planar surface and at least one opening formed therein; forming a first electrode layer over the dielectric layer planar surface and in the opening; forming a controllably conductive media containing an active layer and a passive layer over the first electrode and in the opening; forming a second electrode layer over the controllably conductive media and in the opening; and removing the first and second electrode layers and controllably conductive media on the dielectric layer planar surface so that the remaining second electrode surface in the opening is co-planar with the dielectric layer planar surface. One aspect of the subject invention relates to a memory cell made by the fabrication method.

Another aspect of the subject invention relates a method of preventing formation of voids at interfaces between layers in a memory cell structure. The method includes providing a first electrode over a dielectric layer containing at least one opening; forming a passive layer over the first electrode and in the opening, wherein a element of the passive layer is not contacted with an interface between the first electrode and the dielectric layer in an area of the memory cell; forming an active layer and second electrode layer over the dielectric layer and in the opening; and planarizing the structure. When the active layer is formed, the element of the active layer may not be contacted with interfaces between layers of the passive layer, first electrode, and dielectric in the area of the memory cell.

Chemical-interface contact sometimes results in significant depletion of metal from conductive structures such as electrodes during the processing to form the passive and active layers of the cell and undesirable, uncontrollable void formation in the conductive structures. The metal depletion and void formation have a negative impact on the quality of the manufactured chip by altering the desired electrical properties of and interactions between components on the manufactured chip.

In the memory cell fabrication process in accordance with the subject invention, the passive layer is formed over a continuous electrode in the memory cell area. Since the electrode is continuous and over the entire surface of the memory cell area, there are no exposed interfaces with other layers/materials. Absent the exposed interfaces of the underlying layers, the elements of subsequently formed layers such as chemical vapors do not contact interfaces in the memory cell area, thus preventing void formation in a memory cell.

A memory cell contains at least two electrodes, as one or more electrodes may be deposited between the two electrodes that sandwich the controllably conductive media. The electrodes are made of conductive material, such as conductive metal, conductive metal alloys, conductive metal oxides, conductive polymer films, semiconductive materials, and the like. The controllably conductive media contains an active layer and passive layer.

The memory cells may optionally contain additional layers, such as additional electrodes, charge retention layers, and/or chemically active layers between or in addition to the two electrodes and the controllably conductive media. The impedance of the controllably conductive media changes when an external stimulus such as an applied electric field is imposed. A plurality of memory cells, which may be referred to as an array, forms a memory device.

Figure 1:
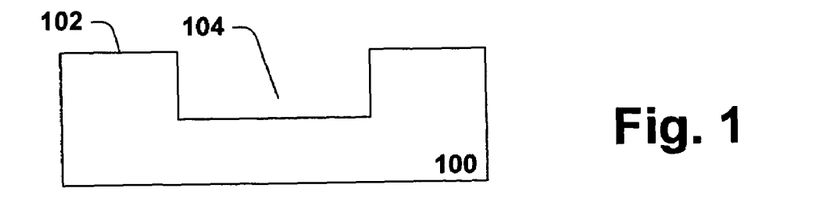
FIGS. 1 to 5 are cross sectional illustrations of a semiconductor substrate of a memory cell undergoing fabrication according to one aspect of the subject invention.

Referring to FIGS. 1 to 5, one of many possible exemplary embodiments of making a memory cell is illustrated. Specifically FIG. 1 shows a cross sectional view of a dielectric layer 100 having a planar surface 102 and an opening 104. Any suitable dielectric material can be used as the dielectric layer 100. Both organic and inorganic dielectric materials may be used. Similarly, both low and high k dielectrics may be used. Also polymeric, amorphous, crystalline and monomeric materials can be used as dielectric materials. Non-limiting examples of dielectric materials include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof.

The dielectric layer 100 can be formed on any substrate (not shown) by any suitable technique. For example, chemical vapor deposition (CVD) such as plasma enhanced chemical vapor deposition (PECVD), low-pressure chemical vapor deposition (LPCVD), and high pressure chemical vapor deposition (HPCVD) can be used. Polymeric dielectrics can also be formed by using spin-coating, dip-coating, or spraying. Optionally, prior to formation of dielectric layer 100 one or more layers of insulators, barriers, metal interconnects, and/or passivization layers can be formed on the substrate.

The dielectric layer 100 has a thickness appropriate to facilitate formation of the opening 104 and subsequent fabrication procedures. Typically, dielectric layer 100 has a thickness from about 0.04 µm to about 100 µm. In one embodiment of the subject invention, dielectric layer 100 has a thickness from about 0.2 µm to about 50 µm. In another embodiment of the subject invention, dielectric layer 100 has a thickness from about 0.5 µm to about 6 µm. The dielectric layer 100 may be formed over substantially the entire surface of the substrate. In one embodiment of the subject invention, the dielectric layer 100 may be formed on part of the surface of the substrate.

The dielectric layer 100 has at least one opening 104 formed therein. The opening 104 may be a via, trench, or line. The opening 104 can be formed by employing any suitable techniques. For example, the opening 104 can be formed by a lithography process followed by etching. Lithography can use both positive and negative resists, which are available commercially. Lithographic techniques for forming openings 104 in a dielectric are well known in the art. Any etching process can be used for forming the opening 104. For example, a plasma etch can be used to form the opening 104. Plasma etch can take place in a parallel plate reactor using an ion-assisted reactant. The resist is completely removed from the dielectric surface and the inside walls of the opening 104 by plasma etching. The opening 104 can have relatively vertical sidewalls which extend perpendicular to the topological surface of the dielectric layer 100.

A suitable amount of the dielectric layer 100 is removed in order to form the opening 104 and at least a portion of the active memory cell in the resulting opening area 104. In one embodiment, the depth of the opening 104 is about 0.01 µm or more and about 25 µm or less. In another embodiment, the depth of the opening 104 is about 0.05 µm or more and about 10 µm or less. In yet another embodiment, the depth of the opening 104 is about 0.1 µm or more and about 5 µm or less. It is to be appreciated that the subject invention is not limited to operating at the above depths of the opening 104. In many instances the above depths of the opening 104 are employed, however, in some instances, smaller or larger depths are employed.

Figure 2:
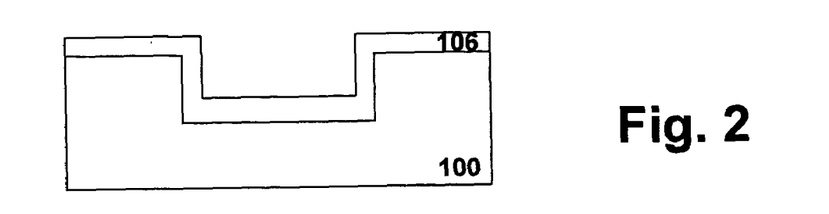

FIG. 2 shows forming of a first electrode layer 106 over the dielectric layer 100. The first electrode 106 is formed over the dielectric layer planar surface 102 and in the opening 104. The first electrode 106 is made of conductive material, such as conductive metal, conductive metal alloys, conductive metal oxides, conductive polymer films, semiconductive materials, and the like. Optionally the electrode layer is doped using techniques such as ion implantation and diffusion. Any suitable dopant may be used.

Any suitable conductive materials can be employed as the first electrode 106. Non-limiting examples of electrode include one or more of aluminum, chromium, copper, germanium, gold, magnesium, manganese, molybdenum, indium, iron, nickel, palladium, platinum, samarium, silver, titanium, tungsten, zinc, and alloys thereof; indium-tin oxide (ITO), indium zinc oxide and other conductive metal oxides and mixtures thereof; polysilicon; doped amorphous silicon; metal silicides; metal carbides, metal nitrides and the like. Alloy electrodes specifically include Hastelloy®, Kovar®, Invar, Monel®, Inconel®, brass, stainless steel, magnesium-silver alloy, and various other alloys.

The first electrode layer 106 is formed by any suitable thin layer formation techniques. For example, CVD (e.g., atmospheric pressure CVD (APCVD), low-pressure CVD (LPCVD), plasma-enhanced CVD (PECVD), and high density plasma (HDP), metal organic CVD (MOCVD), pulsed laser deposition (PLD), and atomic layer CVD (ALCVD)), physical vapor deposition (PVD) (e.g., evaporation, implantation, and sputtering), and the like can be used. Choice of a suitable formation technique depends primarily on the identity of the first electrode layer material, size of substrates being processed, and to some extent, the composition of a dielectric layer 100. It is important to understand that each of the various passive layer formation components has its own set of features and characteristics well known in the art.

For forming the first electrode 106, in one embodiment of the subject invention, a seed layer of metal is formed over the dielectric layer 100. This seed layer is typically on the order of about 1000–3000 Å in thickness and is either pure metal or a metal alloy. The seed layer is formed using a technique such as CVD. After formation of the seed layer, the metal layer is completed by depositing additional metal using electroplating and/or blanket deposition. The additional metal may be either pure metal or an alloy.

The first electrode 106 has a suitable thickness that depends upon the chosen implementations and/or the memory device being fabricated. In one embodiment, the thickness of first electrode 106 is about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

Figure 3:
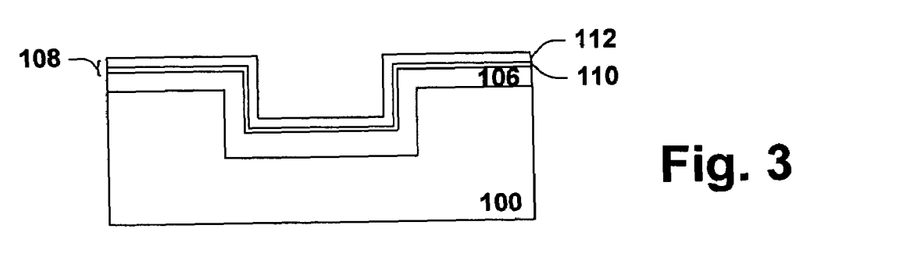

FIG. 3 shows forming of a controllably conductive media 108 over the first electrode 106. The controllably conductive media 108 is formed over the dielectric layer planar surface 102 and in the opening 104. The controllably conductive media 108 can be rendered conductive or non-conductive in a controllable manner using external stimuli. Generally, in the absence of external stimuli, the controllably conductive media 108 is non-conductive or has high impedance. Further, in some embodiments, multiple degrees of conductivity/resistivity may be established for the controllably conductive media 108 in a controllable manner. For example, the multiple degrees of conductivity/resistivity for the controllably conductive media 108 may include a non-conductive state, a highly conductive state, and a semiconductive state.

The controllably conductive media 108 can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media 108 contains one or more active layers 112 and one or more passive layers 110. In one embodiment, the controllably conductive media 108 contains at least one active layer 112 that is adjacent to a passive layer 110 (without any intermediary layers between the active layer and passive layer).

The active layer 112 of the subject invention can be formed using any suitable low conducting material. Examples of materials that can be used in the formation of the active layer 112 include organic semiconductor materials, inorganic semiconductor materials, and mixtures of organic and inorganic semiconductor materials. The active layer 112 can be formed using techniques well known to a person in the art.

General examples of the low conducting inorganic materials include transition metal sulfides, chalcogenides, and transition metal oxides. Some of the examples of low conducting materials may have high conductivity, such as $Cu_2S$. Examples of inorganic materials include copper oxide ($CuO$, $Cu_2O$), iron oxide ($FeO$, $Fe_3O_4$), manganese oxide ($MnO_2$, $Mn_2O_3$, etc), and titanium oxide ($TiO_2$).

General examples of the organic semiconductor materials include at least one of an organic material (such as a conjugated organic monomer, oligomer, or polymer), an organometallic compound (such as a conjugated organometallic compound), an organometallic material (such as a conjugated organometallic monomer, oligomer, or polymer), a Buckyball, a carbon nanotube (such as a C6–C60 carbon nanotubes), and the like.

The active layer can also contain a mixture of organic and inorganic materials. The inorganic material is usually embedded in an organic semiconductor material. The inorganic component of the active layer may be metal either in ionic or elemental form, or in both. For example, $Cu^+$ may be present in the organic material component of the active layer, either by fabrication or by diffusion under electric field. This $Cu^+$ may be reduced to elemental Cu by the programming current. The inorganic component of the active layer may be metal oxide/sulfide. Examples of active layer containing a mixture of organic and inorganic materials include polyphenylacetylene mixed with $Cu_2S$, polyphenylacetylene mixed with $Cu_2O$, and the like. Hereinafter, the subject invention is described using an organic semiconductor layer containing organic semiconductor materials as an exemplary active layer 112.

The organic semiconductor materials have a carbon-based structure, often a carbon-hydrogen based structure. The organic semiconductor materials are typically characterized in that they have overlapping π orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the active layer also influences the degree of conductivity of the active layer.

A carbon nanotube is typically a hexagonal network of carbon atoms (from about 6 to about 60 carbon atoms, typically) that is rolled up into a seamless cylinder. Each end may be capped with half of a Fullerene molecule. Carbon nanotubes may be prepared by the laser vaporization of a carbon target (a cobalt-nickel catalyst may facilitate growth) or a carbon-arc method to grow similar arrays of single-wall nanotubes. A Buckyball is more specifically a Buckminsterfullerene, a soccer ball-shaped 60-atom cluster of pure carbon.

The organic polymer typically contains a conjugated organic polymer. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the active layer 112, such as the conjugated organic polymer, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity-facilitating compound. The ability of the active layer to donate and accept charges and electrically interact with the passive layer also depends on the identity of the conductivity-facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit. The conjugated organic polymer may be linear or branched, so long as the polymer retains its conjugated nature.

In yet another embodiment, the organic semiconductor contains an organometallic polymer (such as a conjugated organometallic polymer), or carbon structures such as carbon nanotubes and Buckyballs. A carbon nanotube is typically a hexagonal network of carbon atoms that is rolled up into a seamless cylinder. Each end may be capped with half of a Fullerene molecule. Carbon nanotubes may be prepared by the laser vaporization of a carbon target (a cobalt-nickel catalyst may facilitate growth) or a carbon-arc method to grow similar arrays of single wall nanotubes. A Buckyball is more specifically a Buckminster-fullerene, a soccer ball shaped 60-atom or 70-atom cluster of pure carbon.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly (trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the active layer 112 is not doped with a salt. In another embodiment, the active layer 112 is doped with a salt. A salt is an ionic compound having an anion and cation. General examples of salts that can be employed to dope the active layer 112 include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

The active layer 112 has a suitable thickness that depends upon the chosen implementations and/or the memory device being fabricated. In one embodiment, the active layer 112 has a thickness of about 0.001 µm or more and about 5 µm or less. In another embodiment, the active layer 112 has a thickness of about 0.01 µm or more and about 2.5 µm or less. In yet another embodiment, the active layer 112 has a thickness of about 0.05 µm or more and about 1 µm or less.

In one embodiment, the active layer 112 contains a thin layer designed to improve or lengthen charge retention time. The thin layer may be placed anywhere within the active layer 112, but typically near the middle of the layer. The thin layer contains any of the electrode materials or the compounds of the below-described heterocyclic/aromatic compound layer. In one embodiment, the thin layer has a thickness of about 50 Å or more and about 0.1 µm or less. In another embodiment, the thin layer has a thickness of about 100 Å or more and about 0.05 µm or less. For example, a memory cell may contain a first electrode 106 of copper, a passive layer 110 of copper sulfide, an active layer 112 of poly(phenylene vinylene), and a second electrode of aluminum, wherein the poly(phenylene vinylene) active layer 112 contains a 250 Å thick layer of copper therein.

In one embodiment, the organic semiconductor material does not contain an organometallic compound. In another embodiment, the organic semiconductor material contains an organic polymer doped with an organometallic compound. In yet another embodiment, the memory cells optionally contain an organometallic compound layer. In still yet another embodiment, the organic semiconductor material contains an organometallic compound.

The active layer 112 is formed by any suitable techniques. For example, the active layer 112 may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low-pressure chemical vapor deposition (LPCVD), plasma enhanced chemical vapor deposition (PECVD), and high density chemical vapor deposition (HDCVD). During formation or deposition, the organic semiconductor material self-assembles between the electrodes. It is not typically necessary to functionalize one or more ends of the organic polymer in order to attach it to an electrode/passive layer 110.

A covalent bond may be formed between the organic semiconductor material 112 and the passive layer 110. Alternatively, close contact is required to provide good charge carrier/electron exchange between the active layer 112 and the passive layer 110. The active layer 112 and the passive layer 110 are electrically coupled in that charge carrier/electron exchange occurs between the two layers.

A passive layer 110 contains at least one conductivity-facilitating compound that contributes to the controllably conductive properties of the controllably conductive media 108. The conductivity-facilitating compound has the ability to donate and accept charges carriers (holes, electrons, and/or ions). The passive layer 110 thus may transport between an electrode and the organic polymer layer/passive layer interface, facilitate charge/carrier injection into the organic polymer layer, and/or increase the concentration of a charge carrier in the organic polymer layer. In some instances, the passive layer 110 may store opposite charges thereby providing a balance of charges in the organic memory device as a whole. Storing charges/charge carriers is facilitated by the existence of two relatively stable oxidation states for the conductivity-facilitating compound.

Generally, the conductivity facilitating compound or an atom in the conductivity-facilitating compound has at least two relatively stable oxidation states. The two relatively stable oxidation states permit the conductivity-facilitating compound to donate and accept charges and electrically interact with the active layer 112. The particular conductivity facilitating compound employed in a given memory cell is selected so that the two relatively stable oxidation states match with the two relatively stable oxidation states of the organic semiconductor material. Matching the energy bands of two relatively stable oxidation states of the organic semiconductor material and the conductivity facilitating compound facilitate charge carrier retention in the active layer 112.

Matching energy bands means that the Fermi level of the passive layer 110 is close to the valence band of the active layer 112. Consequently, the injected charge carrier (into the active layer) may recombine with the charge at the passive layer 110 if the energy band of the charged active layer 112 does not substantially change. Matching energy bands involves compromising between ease of charge injection and length of charge (data) retention time.

The applied external field can reduce the energy barrier between passive layer 110 and active layer 112 depending on the field direction. Therefore, enhanced charge injection in the forward direction field in programming operation and also enhanced charge recombination in reversed field in erase operation can be obtained.

The passive layer 110 may in some instances act as a catalyst when forming the active layer 112, particularly when the active layer 112 contains a conjugated organic polymer. In this connection, the polymer backbone of the conjugated organic polymer may initially form adjacent to the passive layer 110, and grow or assemble away and substantially perpendicular to the passive layer surface. As a result, the polymer backbones of the conjugated organic polymers are self-aligned in a direction that traverses the two electrodes.

Examples of conductivity facilitating compounds that may constitute the passive layer 110 include one or more of copper sulfide ($Cu_xS$, $1 \leq x \leq 2$), copper rich copper sulfide ($Cu_3S$, $Cu_2S$), copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), and the like. The conductivity facilitating compounds do not necessarily dissociate into ions under the strength of the electric field, although ions may move through them. The passive layer 110 may contain two or more subpassive layers, each sublayer containing the same, different, or multiple conductivity facilitating compounds.

In one embodiment, the conductivity-facilitating compound that may constitute at least a portion of the passive layer 110 contains copper sulfide. It is noted that the term copper sulfide layer or region in a memory cell refers to a portion of a memory element or memory cell that contains $Cu_xS_y$, as a conductivity-facilitating compound. In one embodiment, x and y are independently from about 0.5 to about 9. In another embodiment, x and y are independently from about 1 to about 2. Common examples of $Cu_xS_y$ compounds include $Cu_2S_3$, $CuS$, $Cu_{1.5}S$, $Cu_2S$, $Cu_9S_5$, $Cu_3S$, and the like. For simplicity and brevity, all such copper sulfide layers falling within the noted $Cu_xS_y$ formula are generically referred to as copper sulfide layers. The conductivity-facilitating compound does not dissociate into ions under the strength of the electric field.

The passive layer 110 is formed by any suitable techniques. For example, the passive layer 110 may be formed by oxidation techniques, formed by chemical vapor deposition (CVD) optionally including a gas reaction or gas phase deposition, formed by physical vapor deposition (PVD) including vacuum evaporation, implantation techniques, and sputter deposition, and the like. It is to be appreciated that any suitable passive layer formation processes may be employed with the subject invention. Choice of a suitable passive layer formation process depends primarily on the identity of the passive layer material, size of substrates being processed, and to some extent, the composition of the first electrode 106 or dielectric layer 100. It is important to understand that each of the various passive layer formation techniques has its own set of features and characteristics well known in the art.

In one embodiment, a passive layer 110 may be formed using CVD techniques. Any suitable CVD techniques may be employed with the subject invention. For example, an atmospheric pressure CVD (APCVD), low-pressure CVD (LPCVD), plasma-enhanced CVD (PECVD), high density CVD (HDCVD), or high density plasma (HDP) may be employed.

In one embodiment, a passive layer 110 may be formed by a PECVD. The PECVD can form various types of passive layer 110 that includes one or more of the following: copper sulfide ($Cu_2S$, $CuS$) copper oxide ($CuO$, $Cu_2O$), manganese oxide ($MnO_2$), titanium dioxide ($TiO_2$), indium oxide ($I_3O_4$), silver sulfide ($Ag_2S$, $AgS$), iron oxide ($Fe_3O_4$), and the like. In accordance with one or more aspects of the subject invention, the PECVD may form a thin film of conductivity facilitating material such as copper sulfide ($Cu_2S$, $CuS$) on the first electrode 106 to act as a passive layer 110 and facilitate conductivity between the first electrode 106 and other layers that will subsequently be formed to contain a stack making up a memory cell. In one embodiment, the PECVD introduces a gaseous form of copper sulfide above the first electrode 106, with helium optionally being utilized as a carrier gas. The PECVD may optionally utilize a metal organic gas precursor in the process which facilitates depositing the conductivity facilitating compound at a relative low pressure and temperature conditions (e.g., about 0.2 Pa. and from about 200° C. to about 300° C., respectively). The metal organic precursor can be, for example, chelate Cu (II) diethyldithiocarbamate or $Cu(S_2CN(C_2H_5)_2)_2$ (II).

In one embodiment, the passive layer 110 may be formed using oxidation techniques. For example, a passive layer 110 containing copper sulfide is formed by contacting a sulfide compound with the first electrode 106. When a copper sulfide layer is employed as the passive layer 110, the first electrode 106 that is adjacent to the copper sulfide layer contains at least copper, so as to permit formation of the copper sulfide passive layer 110 by a sulfur treatment. In one embodiment, the electrode layer 106 that is adjacent to the copper sulfide passive layer 110 contains at least 50% by weight copper.

The copper sulfide passive layer 110 is formed by the sulfide treatment in the following manner. The copper sulfide passive layer 110 is formed over the first electrode 106 containing at least copper by initially and optionally removing or reducing copper oxide that be present on the first electrode 106. The copper oxide structure may be a copper electrode or a copper pad within an electrode, the electrode with a copper pad or copper electrode adjacent to the subsequently formed copper sulfide passive layer 110. By removing or reducing copper oxide if present, uniformity in the thickness of the subsequently formed copper sulfide layer and the adhesion between the copper sulfide layer and the active layer 112 is improved. Moreover, removing copper oxide facilitates the formation of a copper sulfide passive layer 110 with the exposed or upper regions of the first electrode 106.

Copper oxide removal or reduction, if performed, is carried out in any suitable manner. In one embodiment, the copper oxide on the first electrode surface may be removed by contacting a reducing agent such as $NH_3$ with the first electrode 106. In another embodiment, the first electrode 106 containing the copper oxide on its surface may be heated at sufficient temperature and for a sufficient period of time to facilitate oxide removal/reduction. When heating the first electrode 106, the atmosphere contains one or more inert gases, with or without ammonia, and preferably consists essentially of one or more inert gases. In this connection, in one embodiment, when heating the first electrode 106 containing the copper oxide, the atmosphere contains essentially a nitrogen gas.

In one embodiment, the first electrode 106 containing the copper oxide on its surface is heated from about 200° C. to about 500° C. In another embodiment, the first electrode 106 containing the copper oxide is heated from about 300° C. to about 475° C. In yet another embodiment, the first electrode 106 containing the copper oxide is heated from about 350° C. to about 450° C. In one embodiment, the first electrode 106 containing the copper oxide is heated for a time from about 1 second to about 3 minutes. In another embodiment, the first electrode 106 containing the copper oxide is heated for a time from about 2 seconds to about 2 minutes. In yet another embodiment, the first electrode 106 containing the copper oxide is heated for a time from about 3 seconds to about 1 minute.

After optional copper oxide removal/reduction, a sulfide compound is contacted with the first electrode 106 containing at least copper to form a copper sulfide passive layer 110 in a portion of the first electrode 106. The copper sulfide may be formed over the entire surface of the first electrode 106 including the opening 104.

The sulfide compound is capable of reacting with copper to form a copper sulfide passive layer 110 within or on the original first electrode 106 containing at least copper. Sulfide compounds include Group IA element sulfides. Examples of sulfide compounds include hydrogen sulfide, lithium sulfide, sodium sulfide, potassium sulfide, and the like.

The sulfide compound is contacted with the first electrode 106 containing at least copper in the form of a sulfide compound mixture. The sulfide compound mixture contains one or more sulfide compounds and at least one inert gas. Inert gases include nitrogen, and the noble gases, which include argon, helium, neon, krypton, and xenon. The sulfide compound mixture may be in the form of a gas, a plasma, or a combination of a gas and plasma.

In one embodiment, the sulfide compound mixture contains from about 0.1% to about 100% by weight of at least one sulfide compound and from about 0% to about 99.9% by weight of at least one inert gas. In another embodiment, the sulfide compound mixture contains from about 0.5% to about 20% by weight of at least one sulfide compound and from about 80% to about 99.5% by weight of at least one inert gas. In yet another embodiment, the sulfide compound mixture contains from about 1% to about 10% by weight of at least one sulfide compound and from about 90% to about 99% by weight of at least one inert gas. For example, the sulfide compound mixture may contain about 2% by weight of at least one sulfide compound and about 98% by weight of at least one inert gas, about 5% by weight of at least one sulfide compound and about 95% by weight of at least one inert gas, or about 10% by weight of at least one sulfide compound and about 90% by weight of at least one inert gas.

The sulfide compound is contacted with the first electrode 106 containing at least copper for a time sufficient to facilitate formation of a layer of copper sulfide in a portion of the first electrode 106. In one embodiment, the sulfide compound is contacted with the first electrode 106 containing at least copper for a time from about 1 second to about 60 minutes. The chamber in which the sulfide compound is contacted with the first electrode 106 may be equipped with a mass flow controller.

The sulfide compound is contacted with the first electrode 106 containing at least copper at a temperature sufficient to facilitate formation of a layer of copper sulfide in a portion of the first electrode 106 containing at least copper. In one embodiment, the sulfide compound is contacted with the first electrode 106 at a temperature from about 15° C. to about 500° C.

The sulfide compound is contacted with the first electrode 106 containing at least copper at a pressure sufficient to facilitate formation of a layer copper sulfide in a portion of the first electrode 106. In one embodiment, the sulfide compound is contacted with the first electrode 106 at a pressure from about 0.0001 Torr to about 1,000 Torr.

The thickness of the copper sulfide region within the first electrode 106 depends upon a number of factors including the length of time the sulfide compound is in contact with the first electrode 106, the temperature, the concentration of the sulfide compound in the processing chamber, and the like.

In one embodiment, to improve efficiency of the overall process, both copper oxide removal/reduction and copper sulfide formation can be conducted in the same processing chamber. Alternatively, different chambers may be employed for the copper oxide removal/reduction and uniformly thin copper sulfide formation.

In some instances, to promote long charge retention times (in the active layer), the passive layer 110 may be treated with a plasma after it is formed. The plasma treatment, which may contain an inert gas, modifies the energy barrier of the passive layer 110.

The passive layer 110 has a suitable thickness that depends upon the chosen implementations and/or the memory device being fabricated. In one embodiment, the passive layer 110 containing the conductivity facilitating compound has a thickness of about 2 Å or more and about 0.1 μm or less. In another embodiment, the passive layer 110 has a thickness of about 10 Å or more and about 0.01 μm or less. In yet another embodiment, the passive layer 110 has a thickness of about 50 Å or more and about 0.05 μm or less.

In order to facilitate operation of the memory cells, the active layer 112 is thicker than the passive layer 110. In one embodiment, the thickness of the active layer 112 is from about 10 to about 500 times greater than the thickness of the passive layer 110. In another embodiment, the thickness of the active layer 112 is from about 25 to about 250 times greater than the thickness of the passive layer 110.

Figure 4:
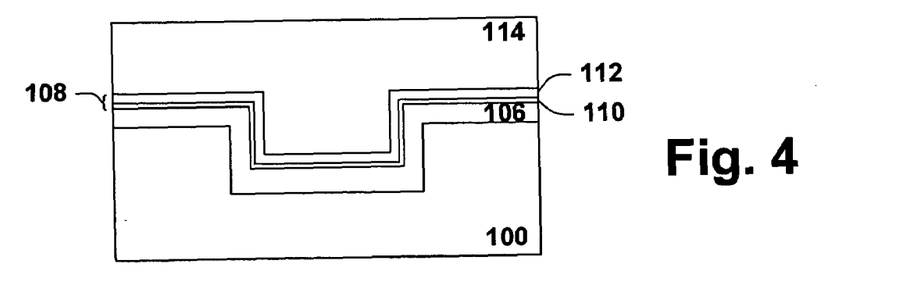

FIG. 4 shows forming of a second electrode layer 114 over the controllably conductive media 108. The second electrode layer 114 is formed over the dielectric layer planar surface 102 and in the opening 104. The second electrode 114 is made of conductive material, such as conductive metal, conductive metal alloys, conductive metal oxides, conductive polymer films, semiconductive materials, and the like. The second electrode layer 114 is formed using any suitable depositing techniques such as CVD, PVD, and the like.

The second electrode layer 114 is formed such that it covers the opening 104. The deposited metal accumulates within the opening 104 to an elevational level above the adjacent surface of the dielectric layer 100. In one embodiment of the subject invention, the metal is filled to cover the dielectric layer 100. Typically, the second electrode layer 114 on the dielectric layer planar surface 102 has a thickness from about the thickness of first electrode 106 is about 0.01 μm or more and about 10 μm or less.

Figure 5:
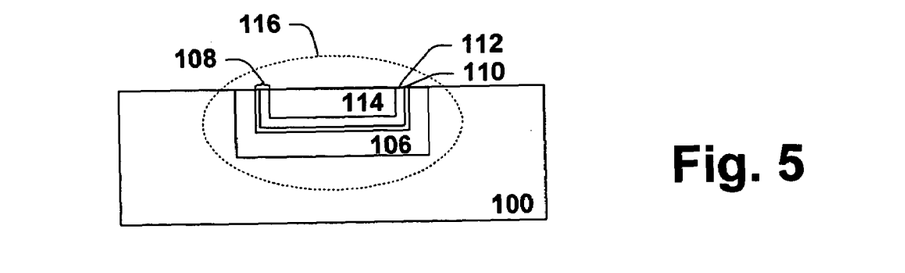

FIG. 5 shows forming of a memory cell 116 by removing the first and second electrode layers 106, 114 and controllably conductive media 108 on the dielectric layer planar surface 102 so that the remaining second electrode surface in the opening 104 is co-planar with the dielectric layer planar surface 102. The first and second electrode layers 106, 114 and controllably conductive media 108 on the dielectric layer planar surface 102 are removed such that the resulting upper face of the second electrode layer 114 is at approximately the same planar level as the dielectric layer planar surface 102. The second electrode layer 114 which remains within the opening 104 may form a bottom electrode or a metal plug. The planarization can be performed by any suitable techniques. For example, chemical mechanical polishing, reactive ion etching, or plasma etching can be used. In one embodiment, in chemical mechanical polishing, the structure is mounted on a rotating platen, pressured by a rotating polishing pad, and buffed by the pad using slurry carrying small particles.

After removing the first and second electrode layers 106, 114 and controllably conductive media 108 on the dielectric layer planar surface 102, the resulting second electrode 114 has a suitable thickness that depends upon the chosen implementations and/or the memory device being fabricated. In one embodiment, the thickness of resulting second electrode is about 0.01 µm or more and about 10 µm or less. In another embodiment, the thickness of the second electrode is about 0.05 µm or more and about 5 µm or less. In yet another embodiment, the thickness of the second electrode is about 0.1 µm or more and about 1 µm or less.

An area of a memory cell 116 means a surface area of the two electrodes 106, 114 directly overlapping each other. The area of the individual memory cells 116 can be small compared to conventional silicon based inorganic memory cells such as metal oxide semiconductor field effect transistors (MOSFETs). In one embodiment, the area of the memory cells 116 of the subject invention is about 0.0001 µm$^2$ or more and about 4 µm$^2$ or less. In another embodiment, the area of the memory cells 116 is about 0.001 µm or more and about 1 µm$^2$ or less.

Operation of the memory devices/cells is facilitated using an external stimulus to achieve a switching effect. The external stimuli include an external electric field and/or light radiation. Under various conditions, the memory cell 116 is either conductive (low impedance or "on" state) or non-conductive (high impedance or "off" state).

The memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information.

Switching the memory cell to the "on" state from the "off" state occurs when an external stimulus such as an applied electric field exceeds a threshold value. Switching the memory cell to the "off" state from the "on" state occurs when an external stimulus does not exceed a threshold value or does not exist. The threshold value varies depending upon a number of factor including the identity of the materials that constitute the memory cell and the passive layer, the thickness of the various layers, and the like.

Generally speaking, the presence of an external stimulus such as an applied electric field that exceeds a threshold value ("on" state) permits an applied voltage to write or erase information into/from the memory cell and the presence of an external stimulus such as an applied electric field that is less than a threshold value permits an applied voltage to read information from the memory cell; whereas the absence of the external stimuli that exceeds a threshold value ("off" state) prevents an applied voltage to write or erase information into/from the memory cell.

To write information into the memory cell, a voltage or pulse signal that exceeds the threshold is applied. To read information written into the memory cell, a voltage or electric field of any polarity is applied. Measuring the impedance determines whether the memory cell is in a low impedance state or a high impedance state (and thus whether it is "on" or "off"). To erase information written into the memory cell, a negative voltage or a polarity opposite the polarity of the writing signal that exceeds a threshold value is applied.

Figure 6:
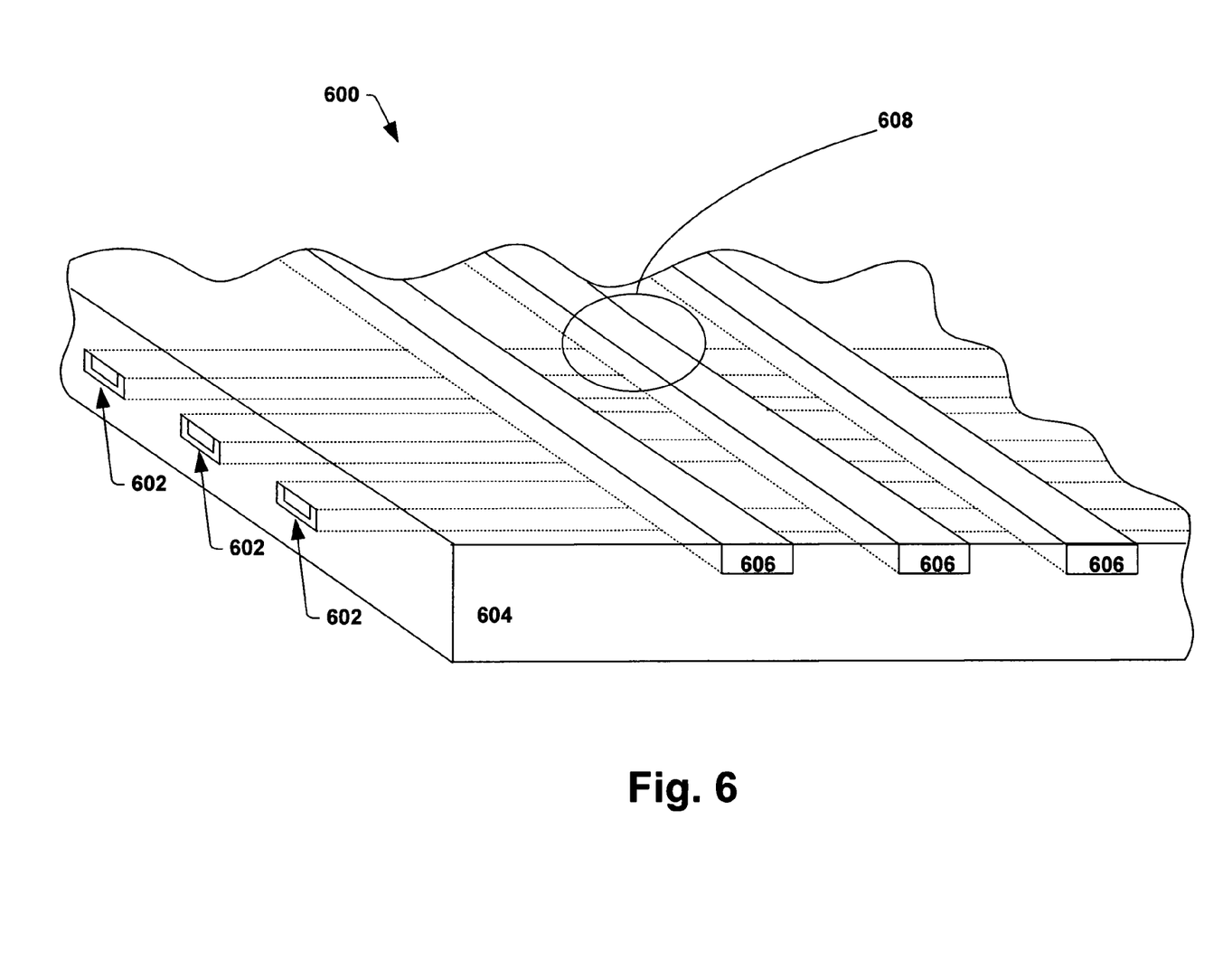
FIG. 6 illustrates a perspective view of a three dimensional microelectronic device containing a plurality of memory cells in accordance with one aspect of the invention.

According to another aspect of the subject invention, a memory device is provided, which exhibits improved conduction properties. Referring to FIG. 6, a brief description of the microelectronic memory device 600 containing a plurality of memory cells 602 in accordance with one aspect of the invention is shown. The memory device 600 contains a desired number of memory cells 602, as determined by the number of rows, columns, and layers (three dimensional orientation described later) positioned on a substrate.

The memory cells 602 for memory device 600 are formed in a dielectric 604, as described earlier. The memory cells 602 and the conductive material 606 are shown in substantially perpendicular orientation, although other orientations are possible to achieve the structure of the exploded view 608. The conductive material 606 is formed using methods known to one skilled in the art. For example, the conductive material 606 is formed by depositing metals using techniques such as etching, PVD, CVD, and the like. In one embodiment of the subject invention, the conductive material 606 can be formed over the second electrode of the memory cell 602.

The conductive material 606 may or may not cover the entire surface of the dielectric layer 604. The conductive material 606 may contain a conductive metal, conductive metal alloys, conductive metal oxides, conductive polymer films, semiconductive materials, or the like. The thickness and width of the conductive material 606 may depend upon the specific lithography and design rules. In one embodiment, the thickness of the conductive material 606 is about 0.01 µm or more and about 10 µm or less. The position of the conductive material 606 is not critical for the subject invention and one skilled in the art would recognize that the memory cell 602 could be placed in a variety of positions without losing the advantages of the subject invention. The conductive material 606 may be patterned to form wordlines using any suitable techniques. It is to be understood that these acts may be repeated to provide a series of suitable layers and conductive paths over one another on the substrate.

Figure 7:
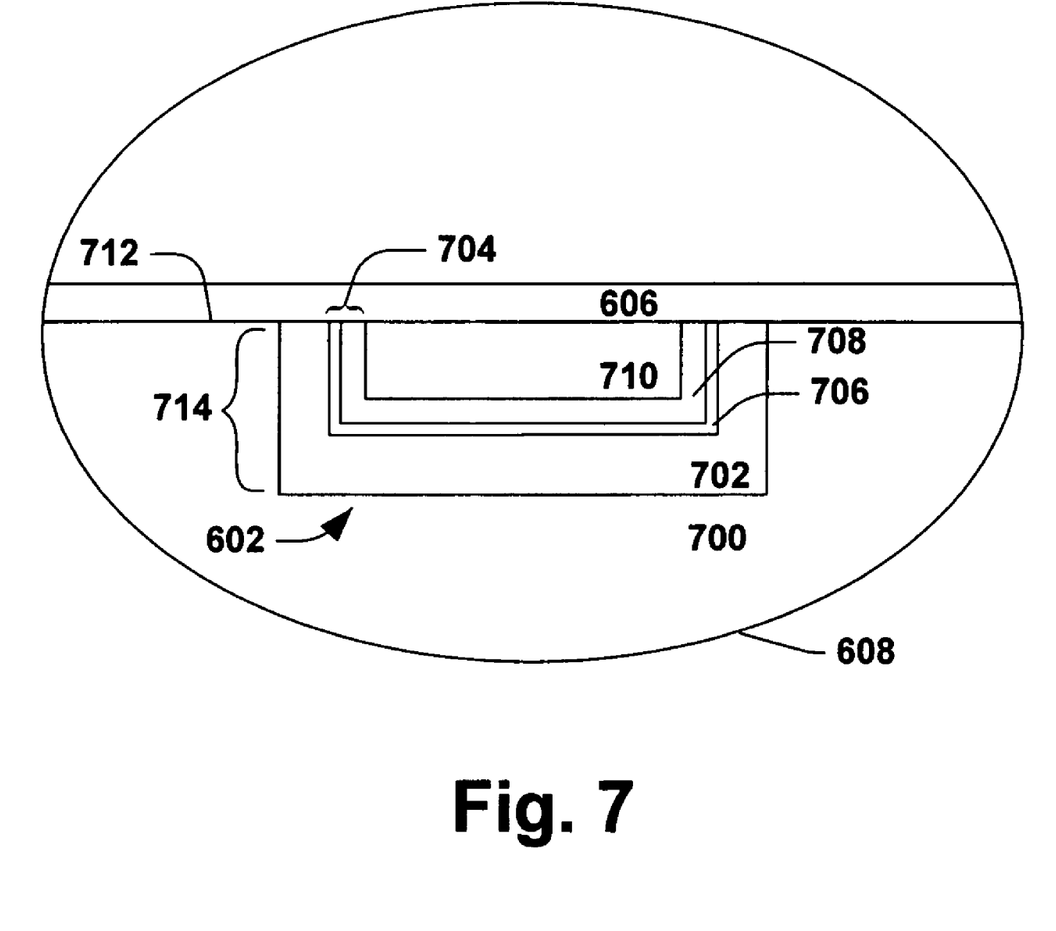
FIG. 7 is an exploded view of a memory cell of the three dimensional microelectronic device described in FIG. 6.

FIG. 7 shows an exploded view 608 of a memory cell 602 shown in FIG. 7. The memory cell 602 contains a dielectric layer 700, a first electrode layer 702, a controllably conductive media 704 containing a passive layer 706 and an active layer 708, and a second electrode layer 710. In this example, conductive material 606 is on the memory cell 602. Peripheral circuitry and devices are not shown for brevity. The fabrication of these components of a memory cell 602 have been described earlier in relation to FIGS. 1–5, and all techniques and materials described there can also be used to manufacture memory cell 602.

In this example, the dielectric layer 700 has a planar surface 712 and a trench 714, and contains silicon. The first electrode 702 containing copper is formed on the dielectric layer planar surface 712 and in the trench 714. After a copper oxide layer (not shown) on the first electrode 702 is removed by heating the first electrode 702 to a temperature of about 400° C. for 15 seconds in a nitrogen atmosphere, a sulfide compound containing essentially about 10% by weight of hydrogen sulfide and about 90% by weight of nitrogen is contacted with the first electrode 702 for about 20 minutes at a temperature of about 50° C. to form a copper sulfide passive layer 706 over the dielectric layer planar surface 712 and in the trench 714. An active layer 708 containing a polymer containing diphenylacetylene portions is formed over the dielectric layer planar surface 712 and in the trench 714 using CVD techniques. After forming a second electrode 710 over the dielectric layer planar surface 712 and in the trench 714, the layers on the dielectric layer planar surface 712 (i.e., the first electrode 702, passive layer 706, active layer 708, and second electrode 710) are removed by chemical mechanical polishing so that the surface of remaining second electrode 710 in the trench 714 is co-planar with the dielectric layer planar surface 712. In this example, the second electrode 710 and conductive material 606 contain aluminum.

Operation of memory devices/cells is facilitated using an external stimulus to achieve a switching effect. The external stimuli include an external electric field and/or light radiation. Under various conditions, the memory cell 602 is either conductive (low impedance or "on" state) or non-conductive (high impedance or "off" state).

The active layer 708 along with the passive layer 706 comprises controllably conductive media 704. The controllably conductive media 704 can be rendered conductive or non-conductive in a controllable manner using an external stimulus. Generally, in the absence of an external stimulus, the controllably conductive media 704 is non-conductive or has high impedance. Further, in some embodiments, multiple degrees of conductivity/resistivity may be established for the controllably conductive media 704 in a controllable manner. For example, the multiple degrees of conductivity/resistivity for the controllably conductive media 704 may include a non-conductive state, a highly conductive state, a semiconductive state, and resistive state(s) with various levels of resistance (in other words, the controllably conductive media 704 may have a plurality of conductive states).

The memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The memory devices may be fabricated in planar orientation (two-dimensional) or three-dimensional orientation containing at least two planar arrays of the memory cells.

The memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a memory cell for a non-volatile semiconductor device, comprising:
   providing a dielectric layer having a planar surface and at least one opening formed therein;
   forming a first electrode layer over the dielectric layer planar surface and in the opening;
   forming a controllably conductive media comprising an active layer and a passive layer over the first electrode and in the opening, the active layer having at least two relatively stable oxidation states and comprising at least one of a chalcogenide, transition metal oxide, and an organic semiconductor material, the passive layer comprising at least one conductivity-facilitating compound having at least two relatively stable oxidation states, wherein the passive layer and the active layer are selected so that energy bands of the two relatively stable oxidation states of the passive layer match with energy bands of the two relatively stable oxidation states of the active layer;
   forming a second electrode layer over the controllably conductive media and in the opening; and
   removing the first and second electrode layers and controllably conductive media on the dielectric layer planar surface so that the remaining second electrode surface in the opening is co-planar with the dielectric layer planar surface.

2. The method of claim 1, wherein removing is carried out by chemical mechanical polishing.

3. The method of claim 1, wherein the active layer comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl) acetylene; poly(trimethylsilyl) diphenylacetylene; poly (carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

4. The method of claim 1, wherein the first electrode layer comprises at least copper.

5. The method of claim 4, wherein the passive layer comprises at least copper sulfide.

6. The method of claim 5, wherein the passive layer comprising at least copper sulfide is formed by contacting a sulfide compound with the first electrode.

7. The method of claim 6, wherein the sulfide compound is contacted with the first electrode for a time about 1 second to about 60 minutes at a temperature from about 15° C. to about 500° C.

8. A method of preventing formation of voids at interfaces between layers in a memory cell structure of a non-volatile semiconductor device, comprising:
providing a first electrode over a dielectric layer having at least one opening;
forming a passive layer over the first electrode and in the opening, wherein a element of the passive layer is not contacted with an interface between the first electrode and the dielectric layer in an area of the memory cell;
forming an active layer over the passive layer and in the opening;
forming a second electrode layer over the active layer and in the opening; and
planarizing the structure, the active layer having at least two relatively stable oxidation states and comprising at least one of a chalcogenide, transition metal oxide, and an organic semiconductor material, the passive layer comprising at least one conductivity-facilitating compound having at least two relatively stable oxidation states, wherein the passive layer and the active layer are selected so that energy bands of the two relatively stable oxidation states of the passive layer match with energy bands of the two relatively stable oxidation states of the active layer.

9. The method of claim 8, wherein a element of the active layer is not contacted with interfaces between layers of the passive layer, first electrode, and dielectric in the area of the memory cell.

10. The method of claim 8, wherein planarizing is carried out by chemical mechanical polishing.

11. The method of claim 8, wherein the active layer comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl) acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

12. The method of claim 8, wherein the first electrode layer comprises at least copper.

13. The method of claim 12, wherein the passive layer comprises at least copper sulfide.

14. The method of claim 13, wherein the passive layer comprising at least copper sulfide is formed by contacting a sulfide compound with the first electrode.

15. The method of claim 14, wherein the sulfide compound is contacted with the first electrode for a time about 1 second to about 60 minutes at a temperature from about 15° C. to about 500° C.

16. A method of making a memory cell for a non-volatile semiconductor device, comprising:
providing a dielectric layer having a planar surface and at least one opening formed therein;
forming a continuous and conformal first electrode layer over the dielectric layer planar surface and in the opening;
forming a controllably conductive media comprising an active layer and a passive layer over the first electrode and in the opening, the controllably conductive media can be rendered conductive, non-conductive or any state therebetween in a controllable manner by an external stimulus, the active layer having at least two relatively stable oxidation states and comprising at least one of a chalcogenide, transition metal oxide, and an organic semiconductor material, the passive layer comprising at least one conductivity-facilitating compound having at least two relatively stable oxidation states, wherein the passive layer and the active layer are selected so that energy bands of the two relatively stable oxidation states of the passive layer match with energy bands of the two relatively stable oxidation states of the active layer;
forming a second electrode layer over the controllably conductive media and in the opening; and
removing the first and second electrode layers and controllably conductive media on the dielectric layer planar surface so that the remaining second electrode surface in the opening is co-planar with the dielectric layer planar surface.

17. The method of claim 16, wherein a element of the active layer is not contacted with interfaces between layers of the passive layer, first electrode, and dielectric in the area of the memory cell.

18. The method of claim 16, wherein planarizing is carried out by chemical mechanical polishing.

19. The method of claim 16, wherein the active layer comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl) acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

20. The method of claim 16, wherein the first electrode layer comprises at least copper.

21. The method of claim 16, wherein the passive layer comprises at least copper sulfide.

22. The method of claim 16, wherein the passive layer and the active layer are formed in a manner so as to prevent void formation in the first electrode layer.

* * * * *